United States Patent [19]
Morris

[11] Patent Number: 5,381,062
[45] Date of Patent: Jan. 10, 1995

[54] MULTI-VOLTAGE COMPATIBLE BIDIRECTIONAL BUFFER

[75] Inventor: Bernard L. Morris, Allentown, Pa.

[73] Assignee: AT&T Corp., Murray Hill, N.J.

[21] Appl. No.: 144,594

[22] Filed: Oct. 28, 1993

[51] Int. Cl.⁶ .............. H03K 19/0185; H03K 19/0948
[52] U.S. Cl. ........................................ 326/68; 326/21; 326/121; 327/546
[58] Field of Search ............ 307/475, 451, 473, 296.5, 307/296.8, 443

[56] References Cited

U.S. PATENT DOCUMENTS

| | | | |
|---|---|---|---|
| 4,704,547 | 11/1987 | Kirsch et al. | 307/443 |
| 4,963,766 | 10/1990 | Lundberg | 307/473 |
| 5,004,936 | 4/1991 | Andresen | 307/475 |
| 5,278,460 | 1/1994 | Casper | 307/451 |
| 5,300,832 | 4/1994 | Rogers | 307/475 |

OTHER PUBLICATIONS

Takahashi et al., *3.3V–5V Compatible I/O Circuit without Thick Gate Oxide*, IEEE 1992 Custom Integrated Circuits Conference, pp. 23.3.1–23.3.4, May 1992.

Primary Examiner—Edward P. Westin
Assistant Examiner—Jon Santamauro

[57] ABSTRACT

An integrated circuit is disclosed comprising a first field effect transistor having a source connected to a first node and a gate connected to a second node, and a second field effect transistor for protecting the first transistor from voltages applied to the first node and greater than a predetermined nominal voltage. The second transistor includes a drain connected to the second node, a source connected to the first node, and a gate connected to a third node. A constant voltage source is coupled to the third node and supplies a gate voltage to the gate of the second transistor such that a drain-source path of the second transistor does not conduct while voltage applied to the first node is generally less than the gate voltage plus a threshold voltage of the second transistor. The constant voltage source comprises a third field effect transistor having a drain and a gate connected to the third node, and a source coupled to a first power supply voltage, such that the gate voltage is substantially equal to the first power supply voltage minus a threshold voltage of the third transistor.

7 Claims, 3 Drawing Sheets

MULTI-VOLTAGE COMPATIBLE BIDIRECTIONAL BUFFER

BACKGROUND OF THE INVENTION

1. Field of the Invention

The present invention relates to circuitry implemented in complementary transistor technology that is compatible with multiple voltages.

2. Related Art

Recent half-micron VLSI (Very Large Scale Integration) circuits include CMOS (Complementary Metal Oxide Semiconductor) transistors having gate oxides of approximately 90 angstroms. The power supply specification for this technology is 3.3 volts (plus or minus 10%). The CMOS transistors in such half-micron VLSI circuits may be damaged if their respective gate oxides are subjected to voltages greater than 3.3 volts.

However, 3.3 volt power supplies are not universal. In fact, many older systems use 5 volt power supplies.

Often, it is necessary for a 3.3 volt circuit to communicate with a 5 volt circuit. In such cases, there is a potential for degraded reliability and damage to the CMOS transistors contained in the 3.3 volt circuit.

Three different types of circuit-to-circuit communication are possible. In the first case, a 3.3 volt output drives a nominally 5 volt input. There are usually no reliability problems with this first case.

In the second case, a 5 volt output drives a nominally 3.3 volt input. This second case represents a potential reliability problem, since the CMOS transistors in the 3.3 volt circuit may be damaged if their gate oxides are exposed to voltages over 3.3 volts. A solution to this problem is presented in U.S. Pat. No. 4,704,547 to Kirsch (hereinafter Kirsch). For convenience of reference, FIG. 2 of Kirsch has been substantially reproduced herein as FIG. 1.

Before considering the circuit shown in FIG. 1, it will be useful to consider FIGS. 4A-4H, which illustrate the symbols used herein to represent transistors. The symbols in FIGS. 4A and 4B both represent a normal n-type MOSFET (Metal Oxide Silicon Field Effect Transistor) transistor. A "normal" transistor is defined herein as comprising those transistors normally employed to implement standard digital electronic circuits, such as enhancement mode transistors that are normally off with zero bias applied to their respective gate electrodes. More particularly, "normal" transistors as defined herein represent enhancement mode transistors having the same threshold voltages as the transistors normally used in digital CMOS circuits. Note that the transistor in FIG. 4B is explicitly shown as having a back gate.

The symbols in FIGS. 4C-4E all represent a normal p-type MOSFET transistor. Note that the transistors in FIGS. 4D and 4E are explicitly shown as having back gates.

The symbols in FIGS. 4F-4H all represent unusual, or abnormal, MOSFET transistors. The transistors shown in FIGS. 4F-4H are not normally employed to implement standard digital electronic circuits.

FIGS. 4F and 4G depict intrinsic p-type and intrinsic n-type MOSFET transistors, respectively. An intrinsic p-type MOSFET transistor is an abnormally high threshold p channel device. An intrinsic n-type MOSFET is an abnormally low threshold n channel device.

FIG. 4H depicts a depletion p-type MOSFET transistor. Depletion type transistors are well known. As will be appreciated, the production of depletion type transistors includes an additional mask processing step to apply a channel dopant which is not required in the production of normal transistors. Thus, depletion type transistors are more complicated and more expensive to produce than normal transistors.

Referring now to FIG. 1, an inverter 102 is shown, which includes a protective transistor T22 having a source-drain path that is serially inserted in the path between the drains of logic transistors T21 and T23. Note that complementary transistors T21, T23 otherwise form by themselves a conventional complementary pair. An input logic signal $V_{IN}$ is applied from a common input node 24 to the gates of transistor T21 and T23, whereas an output logic signal $V_{OUT}$ is taken from the drain of p-channel transistor T21 and the drain of n-channel transistor T22, at common output node 25.

For typical MOS devices, the n-channel transistors are degraded more rapidly by excessive fields than are p-channel transistors. Hence, protective transistor T22 in the Kirsch patent provides that the source-drain potential of n-channel transistor T23 is limited so as not to exceed a given value, even though the positive power supply potential (+V) increases beyond this value. To achieve this end, the gate voltage of protective transistor T22 is placed at protective voltage $V_P$ with respect to ground. The drain voltage (referenced to ground) on T23 is then limited to $V_P - V_{th}$, where $V_{th}$ is the threshold voltage drop across protective transistor T22. Accordingly, transistor T23 is protected against increases in the positive power supply potential (+V), since the drain voltage of transistor T23 is limited to a transistor threshold voltage drop (typically 0.7 volts to 1.0 volt) below the protective voltage $V_P$.

The third circuit-to-circuit communication case involves a bidirectional bus, such as in a bidirectional buffer having an input circuit and an output circuit both connected to a pad. This third case represents a potential reliability problem, since the CMOS transistors in the 3.3 volt input and output circuits may be damaged if their gate oxides are exposed to voltages over 3.3 volts (wherein such voltages are applied to the pad).

A solution to this problem is presented in "3.3 V-5 V Compatible I/O Circuit Without Thick Gate Oxide" by Takahashi et al., IEEE 1992 Custom Integrated Circuits Conference, 1992 (hereinafter Takahashi). For convenience of reference, FIG. 1(b) of Takahashi has been substantially reproduced herein as FIG. 2A. FIG. 2B illustrates the symbols used in FIG. 2A to represent different voltage levels.

Referring now to FIG. 2A, an input stage 202 is shown which is protected from voltages applied to a Pad. Specifically, a pull-down transistor MN4 is protected against a high voltage level (that is, greater than 3.3 volts) applied to the Pad by an intrinsic n-type MOSFET transistor MN3. This protection scheme is essentially the same as that described in Kirsch. Specifically, the transistor MN4 is protected since its drain voltage is limited to the gate voltage of the protective transistor MN3 minus the threshold voltage of the protective transistor MN3.

Takahashi also protects a pull-up transistor MP3. Transistor MP2, a depletion P-channel device, is placed between the drain and gate of transistor MP3. When the voltage applied to the Pad goes above VDD (which is typically 3.3 volts), transistor MP2 turns on, so that the voltage across the gate of MP3 is essentially zero.

During normal operation, when MP3 is an active output device, MP2 is ideally always off. This condition is necessary to prevent leakage between node N6 (held low) and the output (held high). However, this condition can only be achieved by tightly controlling the threshold voltage of transistor MP2. In addition, since node N6 cannot go above VDD minus $V_{tn(MN2)}$, which represents the threshold voltage of transistor MN2, MP3 will leak when it is supposed to be off unless its threshold voltage is always greater than $V_{tn(MN2)}$.

In order to satisfy these strict threshold voltage requirements, many of the transistors in the Takahashi circuit are implemented as intrinsic devices. For example, transistor MP3 is implemented as an intrinsic p-type transistor, which is an abnormally high threshold p channel device (as discussed above). As shown in FIG. 2A, transistors MN2, MN3, and MN6 are also implemented as intrinsic devices in order to satisfy the threshold voltage requirements discussed above.

Thus, Takahashi solves the problems associated with the third circuit-to-circuit communication case by using abnormal transistor devices and, in particular, by using intrinsic transistor devices. However, the fabrication process involved in producing a circuit which includes normal and abnormal transistor devices is much more complex and expensive than the fabrication process involved in producing a circuit which includes only normal transistor devices. This is the case, since the inclusion of abnormal transistor devices in a circuit introduces additional processing variables (associated with the abnormal transistor devices) which must be considered both independent of and in combination with the processing variables associated with the normal transistor devices.

Additionally, the use of abnormal transistor devices does not solve the problems associated with transistor MP2. As will be appreciated, the threshold voltage of MP2 must be strictly controlled to ensure that MP2 is always off during normal operation. Typical digital fabrication systems, however, have process variances of plus or minus 100 millivolts. Thus, typical digital fabrication systems cannot be used to produce the Takahashi buffer.

Thus, while it may protect transistor devices from the application of high voltages, Takahashi does not represent an ideal solution.

SUMMARY OF THE INVENTION

Briefly stated, the present invention is directed to an integrated circuit comprising a first field effect transistor having a source connected to a first node and a gate connected to a second node, and a second field effect transistor for protecting the first transistor from voltages applied to the first node and greater than a predetermined nominal voltage. The second transistor includes a drain connected to the second node, a source connected to the first node, and a gate connected to a third node.

A constant voltage source is coupled to the third node and supplies a gate voltage to the gate of the second transistor such that a drain-source path of the second transistor does not conduct while voltage applied to the first node is generally less than the gate voltage plus a threshold voltage of the second transistor. The constant voltage source comprises a third field effect transistor having a drain and a gate connected to the third node, and a source coupled to a first power supply voltage, such that the gate voltage is substantially equal to the first power supply voltage minus a threshold voltage of the third transistor.

The second and third transistors each have a back gate. The back gate of the second transistor is coupled to a second power supply voltage and the back gate of the third transistor is coupled to the first power supply voltage. The second power supply voltage is greater than the first power supply voltage such that the second transistor threshold voltage is greater than the third transistor threshold voltage.

Further features and advantages of the present invention, as well as the structure and operation of various embodiments of the present invention, are described in detail below with reference to the accompanying drawings. In the drawings, like reference numbers indicate identical or functionally similar elements.

BRIEF DESCRIPTION OF THE FIGURES

The present invention will be described with reference to the accompanying drawings, wherein.

DETAILED DESCRIPTION OF THE PREFERRED EMBODIMENTS

The present invention relates to a logic circuit implemented in complementary transistor technology that is compatible with multiple voltages. The present invention is illustrated herein in terms of CMOS field effect technology. However, the present invention is applicable to other forms of complementary transistors. For example, the present invention can be applied to complementary transistors made using gallium arsenide technology, when such technology becomes available.

Before describing the present invention in detail, it will be useful to discuss the terminology that is used herein. The terms "high voltage state," "high voltage signal," and the like refer to the voltage level of VDD. The terms "low voltage state," "low voltage signal," and the like refer to the voltage level of VSS. When a transistor is said to be "on," or in an "on state", it is meant that the transistor is conducting between its drain electrode and source electrode. When a transistor is said to be "off," or in an "off state", it is meant that the transistor is not conducting between its drain electrode and source electrode.

Herein, the terms "gate" and "gate electrode" are used interchangeably. The terms "source" and "source electrode" are used interchangeably, the terms "drain" and "drain electrode" are used interchangeably, and the terms "back gate electrode" and "back gate" are used interchangeably.

Preferably, VDD is 3.3 volts and VSS is ground, or 0.0 volts. The symbol VD5 refers to 5 volts. VDD, VSS, and VD5 may alternatively be set to other voltage values without departing from the scope and spirit of the present invention, as long as the operational features of the present invention (as described herein) are satisfied. Various values are provided below for the threshold voltages of the respective transistors. It should be understood that these voltage values are given for illustrative purposes only and are not limiting.

VDD and VD5 are provided by well known voltage sources. Such voltage sources do not form a pan of the present invention and, therefore, shall not be described further.

Figure 1:
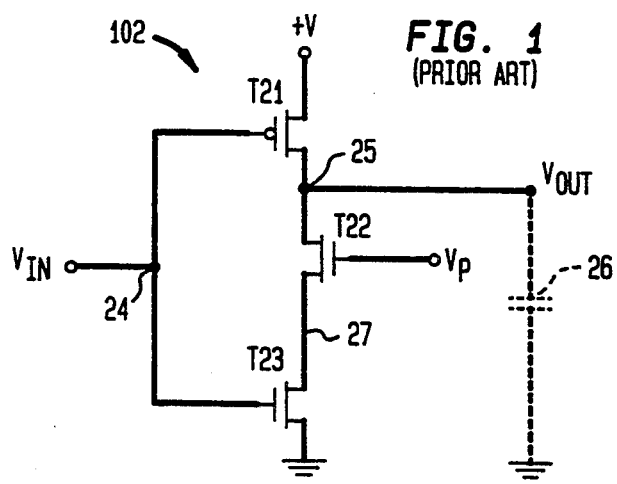
FIG. 1 is a circuit diagram of a first conventional protection mechanism.
Figure 2B:
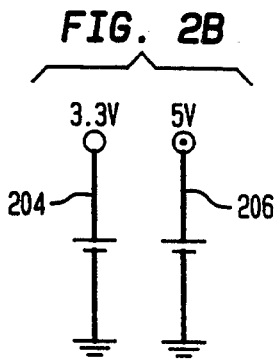
FIG. 2B illustrates the symbols used in the circuit diagram of FIG. 2A to represent different voltage levels.
Figure 2A:
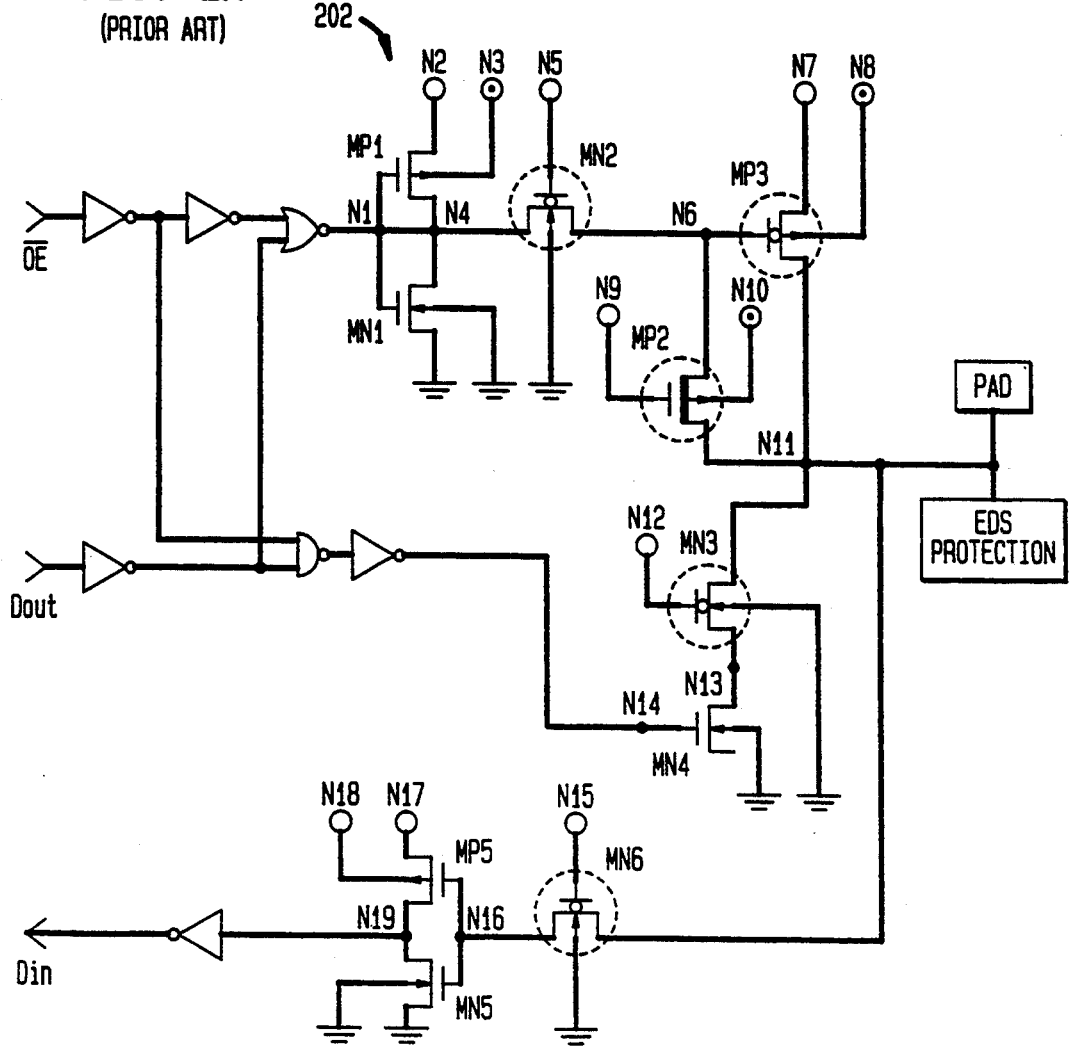
FIG. 2A is a circuit diagram of a second conventional protection mechanism.
Figure 3:
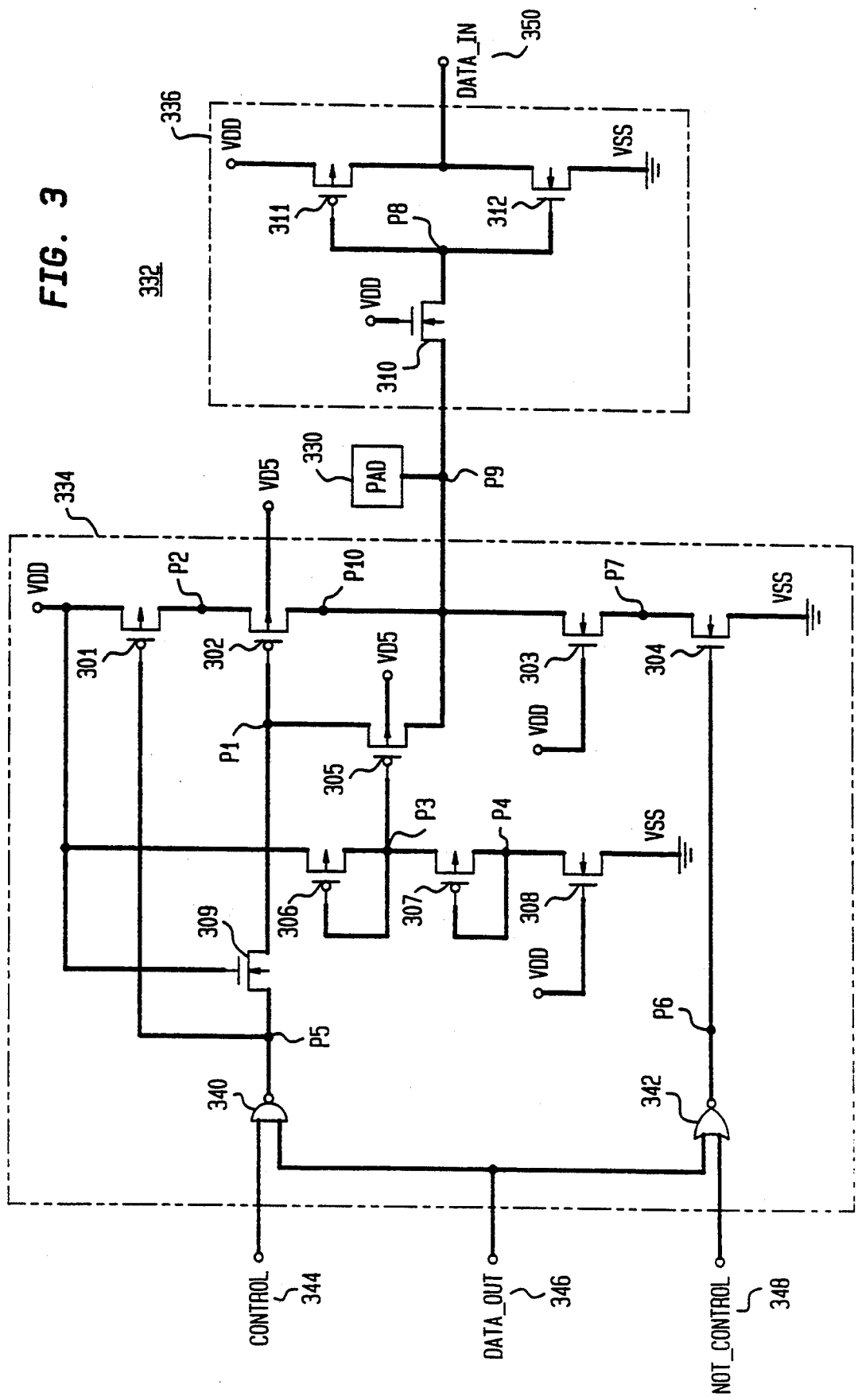
FIG. 3 is a circuit diagram of a bidirectional buffer according to a preferred embodiment of the present invention.
Figure 4A:
FIGS. 4A–4H illustrate symbols used herein to represent different types of transistors.
Figure 4B:
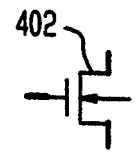
Figure 4C:
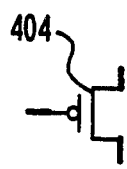
Figure 4D:
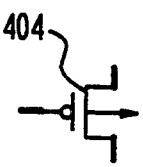
Figure 4E:
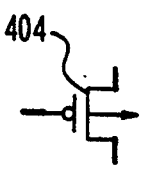
Figure 4F:
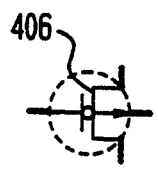
Figure 4G:
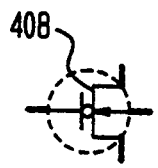
Figure 4H:
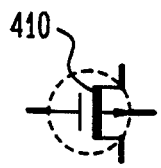

FIG. 3 is a circuit diagram of a bidirectional buffer 332 according to a preferred embodiment of the present invention. A bidirectional buffer is included in the term "logic circuit" as used herein. It should be understood from the outset that the bidirectional buffer 332 of the present invention is implemented using only normal N-type and P-type MOSFET transistors. Thus, fabrication of the bidirectional buffer 332 is facilitated, and the cost of such fabrication is minimized, since only the fabrication processing variables associated with normal transistor devices need be considered.

The bidirectional buffer 332 includes an output buffer 334 and an input buffer 336. The output buffer 334 is connected to a "control" node 344, a "data_out" node 346, and a "not_control" node 348. The voltage level of the signal applied to the not_control node 348 is always opposite to that applied to the control node 344. The input buffer 336 is connected to a "data_in" node 350. Both the output buffer 334 and the input buffer 336 are connected to a common "pad" node 330.

The bidirectional buffer 332 operates in either an input mode or an output mode. The signal applied to the control node 344 (and its inverse applied to the not_control node 348) determines whether the bidirectional buffer 332 is in the input mode or the output mode.

Specifically, when the signal applied to the control node 344 is high, the bidirectional buffer 332 is in the output mode. While the bidirectional buffer 332 is in the output mode, the signal applied to the data_out node 346 is transferred (or output) to the pad 330. For example, if the signal applied to the data_out node 346 is in a high voltage state while the bidirectional buffer 332 is in the output mode, then the signal present on the pad 330 will be in a high voltage state. Similarly, if the signal applied to the data_out node 346 is in a low voltage state while the bidirectional buffer 332 is in the output mode, then the signal present on the pad 330 will be in a low voltage state. In this manner, the signal present on the data_out node 346 is output to the pad 330 while the bidirectional buffer 332 is in the output mode.

The bidirectional buffer 332 is in the input mode when the signal applied to the control node 344 is in a low voltage state. While the bidirectional buffer 332 is in the input mode, the output buffer 334 is said to be in a tri-state condition, such that the output buffer 334 does not affect the signal on the pad 330.

While the bidirectional buffer 332 is in the input mode, the input buffer 336 operates to inversely convey the signal applied on the pad 330 by an external source (not shown) to the data_in node 350. Therefore, if a low voltage signal is applied on the pad 330 while the bidirectional buffer 332 is in the input mode, then the signal at the data_in node 350 will be in a high voltage state. Similarly, if a high voltage signal is applied on the pad 330 while the bidirectional buffer 332 is in the input mode, then the signal at the data_in node 350 will be in a low voltage state.

The operation of the output buffer 334 while the bidirectional buffer 32 is in the output mode shall now be described in detail.

There are two "output mode" cases which must be considered. The first case occurs when the bidirectional buffer 332 is in the output mode (that is, a high voltage signal is applied on the control node 344) and a high voltage signal is applied on the data_out node 346. The second case occurs when the bidirectional buffer 332 is in the output mode (that is, a high voltage signal is applied on the control node 344) and a low voltage signal is applied on the data_out node 346. The first case shall first be discussed.

When a high voltage signal is applied to the control node 344 (and, correspondingly, a low voltage signal is applied to the not_control node 348), a NAND gate 340 and a NOR gate 342 operate as inverters, such that the voltage at node P5 is low, and the voltage at node P6 is low. Node P5 is connected to the gate of a normal p-type MOSFET transistor 301. Since node P5 is low, the gate of transistor 301 is low, and thus, transistor 301 is on.

Normal n-type MOSFET transistor 309 is configured to operate as a source follower. N channel source followers operate as follows. As long as the gate of an N channel source follower is high, the voltage at the source follows the voltage at the drain. However, the voltage at the source cannot exceed the voltage at the gate minus the threshold voltage of the transistor.

The gate of transistor 309 is connected to VDD and, thus, the voltage at the source of transistor 309 follows the voltage at the drain of transistor 309. The drain of transistor 309 is connected to node P5 and the source of transistor 309 is connected to node P1. Since node P5 is low during the first "output mode" case, node P1 is also low. The gate of normal p-type MOSFET transistor 302 is connected to node P1. Consequently, transistor 302 is on. Therefore, both transistors 301 and 302 are on, and operate to pull the voltage at the pad 330 up to VDD.

The voltage at node P6 is low. The gate of normal N-type MOSFET transistor 304 is connected to node P6. Thus, transistor 304 is off, thereby essentially creating an open circuit between the pad 330 and VSS (e.g., ground). Therefore, the transistor 304 does not operate to pull down the voltage at the pad 330 to VSS. In other words, transistor 304 does not interfere with the "pulling up" operation of transistors 301 and 302.

Therefore, during the first "output mode" case when a high voltage signal is applied on the data_out node 346, the voltage present at the pad 330 is high.

Consider now the second "output mode" case when the voltage at the control node 344 is high, and the voltage at the data_out node 346 is low. The voltage at node P5 is high, and the voltage at node P6 is high. Since the voltage at P6 is high, the N,type transistor 304 is on. The normal N-type MOSFET transistor 303 is always on since its gate is connected to VDD. Thus, the transistors 303 and 304 are both on, such that the voltage at the pad 330 is pulled down to VSS.

Consider now the operation of transistors 301 and 302. Since the voltage at node P5 is high, the p-type transistor 301 is off. Note that the back gate of transistor 302 is connected to VD5, which is nominally 5 volts. As will be appreciated by persons skilled in the relevant art, when a normal p-type MOSFET transistor (such as transistor 302) has its back gate connected to a voltage higher than VDD, the threshold voltage of the transistor increases by approximately 100 to 200 millivolts.

Therefore, the threshold voltage of transistor 302 is approximately 1.2 volts.

The voltage at node P1 is, at most, $VDD - V_{th(309)}$, where $V_{th(309)}$ represents the threshold voltage of transistor 309. Preferably, VDD is 3.3 volts and $V_{th(309)}$ is approximately 1 volt. Thus, the voltage at node P1 is no more than approximately 2.3 volts. This voltage level at node P1 may or may not be high enough to turn p-type transistor 302 completely off (this is particularly true, given the relatively high threshold voltage of transistor 302, as described above). However, it does not matter whether transistor 302 is on or off since transistor 301 is off. Consequently, there is an open circuit between VDD and the pad 330, such that the transistors 301 and 302 do not operate to pull up the voltage at the pad 330 to VDD. In other words, transistors 301 and 302 do not interfere with the "pulling down" operation of transistors 303 and 304.

The bidirectional buffer 332 is in the input mode when a low voltage signal is applied to the control node 344. During this time, the voltage at node P5 is high, and the voltage at node P6 is low. This is the case, irrespective of the voltage on the data_out node 346.

Since the voltage at node P5 is high, the p-type transistor 301 is off. As discussed above, the p-type transistor 302 may or may not be off, but the state of the transistor 302 is irrelevant since transistor 301 is off. Specifically, since transistor 301 is off, an open circuit exists between VDD and the pad 330 such that the voltage at the pad 330 is not pulled up to VDD.

Since the voltage at node P6 is low, the n-type transistor 304 is off. Thus, an open circuit exists between the pad 330 and VSS, or ground, such that the voltage at the pad 330 is not pulled down to VSS.

Consequently, while the bidirectional buffer 332 is in the input mode, the output buffer 334 does not affect the signal present on the pad 330. The output buffer 334 is said to be in a tri-state condition.

The operation of the input buffer 336 is the same during both the output mode and the input mode. The input buffer 306 shall now be discussed.

A normal N-type MOSFET transistor 310 is a source follower, with its gate being connected to VDD. Thus, the voltage at node P8 follows the voltage at the pad 330, but does not exceed $VDD - V_{th(310)}$, where $V_{th(310)}$ represents the threshold voltage of transistor 310. Preferably, VDD is 3.3 volts and $V_{th(310)}$ is approximately 1 volt. Thus, the voltage at node P8 does not exceed approximately 2.3 colts.

As will be appreciated, normal p-type MOSFET transistor 311 and normal N-type MOSFET transistor 312 form an inverter circuit, where the voltage at data_in node 350 is an inverted representation of the voltage at node 8. Since the voltage at node P8 follows the voltage at the pad 330, the input buffer 336 operates to inversely transfer the voltage at the pad 330 to the data$_{13}$ in node 350.

Preferably, a receive circuit (not shown) is connected to the data_in node 350. While the bidirectional buffer 332 is in the input mode, the receive circuit receives and processes the signal present on the data_in node 350. While the bidirectional buffer 332 is in the output mode, the receive circuit preferably ignores the signal present on the data_in node 350. The receive circuit does not form a part of the present invention, and therefore is not described further.

As indicated above, the bidirectional buffer 332 is implemented as a half-micron VLSI circuit and includes only normal N-type and P-type MOSFET transistors having gate oxides of approximately 90 angstroms. The power supply specification for this technology is 3.3 volts (plus or minus 10%). These MOSFET transistors may be damaged if their respective gate oxides are subjected to voltages greater than 3.3 volts.

As discussed above, during the input mode an external source (not shown) applies a voltage to the pad 330. This external source may be part of an older system having a power supply of 5 volts. In this case, the transistors in the bidirectional buffer 332 could be potentially damaged since they would be subjected to voltages greater than 3.3 volts.

Accordingly, the present invention provides protective transistors 303, 305, and 310. Protective transistor 303 protects transistor 304 against high voltages (greater than 3.3 volts) applied to the pad 330. Protective transistor 305 protects transistor 302, and protective transistor 310 protects transistors 311 and 312. Transistors 306–309 also form part of the protection mechanism of the present invention. These transistors shall now be described in detail.

Consider first the protection afforded by n-type transistor 310. As discussed above, transistor 310 is a source follower. Thus, the voltage at node P8 follows the voltage at the pad 330, but does not exceed $VDD - V_{th(310)}$, where $V_{th(310)}$ represents the threshold voltage of transistor 310. Preferably, VDD is 3.3 volts and $V_{th(310)}$ is approximately 1 volt. Thus, the voltage at node P8 does not exceed approximately 2.3 volts. Likewise, the voltage applied to the respective gates of transistors 311 and 312 does not exceed 2.3 volts. In this manner, transistor 310 protects transistors 311 and 312 against high voltages (greater than 3.3 volts) applied to the pad 330.

Consider now transistors 303 and 305, which protect the output buffer 334. When the output buffer 334 is in the tri-state condition, protection of the electrical components contained therein is assured since nodes P1 and P5 are high (that is, at VDD). During other times, the transistors 302 and 304 could be damaged if a voltage greater than VDD is applied to the pad 330. This could occur either while the bidirectional buffer 332 is in the input mode, or when the bidirectional buffer 332 is in the output mode (such as when a high voltage is inadvertently applied to the pad 330 while the bidirectional buffer 332 is in the output mode), or when the bidirectional buffer 332 is transitioning from the output mode to the input mode, and has not settled into the tri-state condition. In such cases, protective transistors 303 and 305 protect the transistors 304 and 302, respectively, from damage.

Consider first the protection afforded by n-type transistor 303. Transistor 303 is also a source follower. Thus, the voltage at node P7, which is connected to the source of transistor 303, follows the voltage at the pad 330, which is connected to the drain of transistor 303. However, this voltage at node P7 does not exceed VDD minus $V_{th(303)}$, where $V_{th(303)}$ represents the threshold voltage of transistor 303. Preferably, VDD is 3.3 volts and $V_{th(310)}$ is approximately 1 volt. Thus, the voltage at node P7 does not exceed approximately 2.3 volts. Likewise, the voltage applied across the gate oxide of transistor 304 does not exceed 2.3 volts. In this manner, transistor 303 protects transistor 304 against high voltages (greater than 3.3 volts) applied to the pad 330.

Consider now the protection afforded by p-type transistor 305. During normal operation of the bidirectional buffer 332 (that is, when voltages greater than VDD are not applied to the pad 330), transistor 305 is off due to the operation of transistors 306–308. This is described below.

As it will be appreciated by persons skilled in the relevant art, the normal p-type MOSFET transistor 306 represents a diode. The normal n-type MOSFET transistor 308 represents a large value resistor. Consequently, the voltage at node P3 is always equal to approximately $VDD - V_{th(306)}$, where $V_{th(306)}$ represents the threshold voltage of transistor 306. Note that the normal p-type MOSFET transistor 307, which also operates as a diode, is used for energy conservation. The presence of transistor 307 is optional, and alternatively node P3 could be shorted to node P4.

The back gate of transistor 306 is connected to VDD. Therefore, the threshold voltage of transistor 306 is approximately 1 volt, such that the voltage at node P3 is always approximately 3.3 volts minus 1 volt, or 2.3 volts. The gate of p-type transistor 305 is connected to node P3, and the source of p-type transistor 305 is connected to the pad 330. The back gate of the transistor 305 is connected to VD5, which is nominally 5 volts.

As will be appreciated by persons skilled in the relevant art, when a normal p-type MOSFET transistor (such as transistor 305) has its back gate connected to a voltage higher than VDD, the threshold voltage of the transistor increases by approximately 100 to 200 millivolts. Therefore, the threshold voltage of transistor 305 is approximately 1.2 volts, which is approximately 100 to 200 millivolts greater than the threshold voltage of transistor 306.

Therefore, the transistor 305 turns on only when the voltage at pad 330 is equal to or greater than 2.3 volts (that is, the voltage at node P3) plus 1.2 volts (that is, the threshold voltage of transistor 305), or approximately 3.5 volts. During normal operation, the voltage at the pad 330 does not exceed VDD, or approximately 3.3 volts. Thus, during normal operation of the bidirectional buffer 332, transistor 305 is never on.

It is noted that the threshold voltages of transistors 305 and 306 may vary due to many factors, such as fabrication variables and the respective operating temperatures of the transistors 305 and 306. However, since the back gate of transistor 306 is connected to VDD, while the back gate of transistor 305 is connected to VD5, the threshold voltage of transistor 306 is guaranteed to be always less than the threshold voltage of transistor 305. This ensures that the transistor 305 will always be off during normal operation of the output buffer 334.

During abnormal operation of the bidirectional buffer 332 (that is, when voltages greater than VDD are applied to the pad 330), transistor 305 turns on and operates to protect transistor 302. This is described below.

The transistor 305 turns on when the voltage applied to the pad 330 is greater than or equal to approximately 3.5 volts (this is described above). When transistor 305 turns on, the voltage at node P1 is pulled up to the voltage at the pad 330. The voltage at node P10 is equal to the voltage at the pad 330. Note that node P1 is connected to the gate of transistor 302, and node P10 is connected to the drain of transistor 302. Therefore, the voltage applied across the gate oxide of transistor 302 is essentially zero, such that the transistor 302 is not harmed by excessive voltages applied to the pad 330.

Note, however, that the voltage at node P1 could potentially harm NAND gate 340 if such voltage, was directly applied to the NAND gate 340. Accordingly, protective transistor 309 is provided to protect NAND gate 340 from excessive voltages applied to node P1. As discussed above, transistor 309 is a source follower, such that the voltage at node P5 follows the voltage at node P1, but does not exceed $VDD - V_{th(309)}$, where $V_{th(309)}$ represents the threshold voltage of transistor 309. In this manner, the NAND gate 340 is protected from excessive voltages at node P1.

It is noted that, by definition, the source of an n-type MOSFET transistor is the transistor's most negative terminal, and the drain of an n-type MOSFET transistor is the transistor's most positive terminal. The source of a p-type MOSFET transistor is the transistor's most positive terminal, and the drain of an p-type MOSFET transistor is the transistor's most negative terminal.

When the voltage at node P1 is equal to the voltage at the pad 310, the most negative terminal of n-type transistor 309 is the terminal connected to node P5. This terminal is, by definition, the source of transistor 309. Thus, when the voltage at node P1 is equal to the voltage at the pad 310, node P5 is connected to the source of transistor 309, and node P1 is connected to the drain of transistor 309. Accordingly, the voltage at node P5 follows the voltage at node P1, subject to the limitations discussed above.

The presence of the transistor 309 compromises the operation of the output buffer 334 when the transistor 304 is pulling the voltage at the pad 330 down, since the transistor 302 may not be fully off when the voltage at node P5 is high. To solve this problem, the output buffer 304 includes transistor 301, which is off when the voltage at node P5 is high, such that it is irrelevant whether the transistor 302 is on or off. This was discussed above.

In an alternate embodiment, transistor 302 is protected by inserting a normal n-type MOSFET transistor (called the "alternate" transistor for reference purposes) in series between transistor 302 and node P9 (in this case, transistor 301 is not necessary and node P2 is shorted to VDD). The gate of the alternate transistor is connected to VDD, such that the alternate transistor is a source follower. Thus, the alternate transistor protects transistor 302 in the same manner that transistor 303 protects transistor 304.

However, this alternate protective mechanism reduces the maximum voltage which the output buffer 334 can generate and apply to the pad 330 to VDD minus $V_{th(alt)}$, where $V_{th(alt)}$ represents the threshold voltage of the alternate transistor. While in the output mode, the output buffer 334 must be able to generate at the pad 330 a maximum voltage of no less than 2.4 volts in order to satisfy the well-known TTL (transistor transistor logic) 3.3 volt standards. However, depending on the particular values of VDD and $V_{th(alt)}$, the maximum voltage obtainable at the pad 330 may be less than 2.4 volts, due to the maximum voltage limitations imposed by the alternate transistor. Thus, while protecting transistor 302, this alternate protection mechanism is not ideal since it may prevent the output buffer 334 from complying with the TTL voltage standards.

In contrast, the output buffer 334 having the protection mechanism shown in FIG. 3 does satisfy the TTL voltage standards since the maximum voltage generated by the output buffer 334 at the pad 330 is approximately VDD, which is preferably 3.3 volts.

The present invention has been described with reference to a bidirectional buffer, although persons skilled in the art will find it apparent to apply the protection mechanisms described herein to other types of circuit devices.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. An integrated circuit, comprising:

a first field effect transistor having a drain connected to a first node and a gate connected to a second node;

a second field effect transistor for protecting said first transistor from voltages applied to said first node which are greater than a predetermined nominal voltage, said second transistor having a drain connected to said second node, a source connected to said first node, and a gate connected to a third node;

a constant voltage source, coupled to said third node, for supplying a gate voltage to said gate of said second transistor such that a drain-source path of said second transistor does not conduct while voltage applied to said first node is generally less than said gate voltage plus a threshold voltage of said second transistor;

said constant voltage source comprising a third field effect transistor having a drain and a gate connected to said third node, and a source coupled to a first power supply voltage, said gate voltage being substantially equal to said first power supply voltage minus a threshold voltage of said third transistor; and said second and third transistors each having a back gate, the back gate of said second transistor being coupled to a second power supply voltage and the back gate of said third transistor being coupled to said first power supply voltage, said second power supply voltage being greater than said first power supply voltage such that said second transistor threshold voltage is greater than said third transistor threshold voltage.

2. The integrated circuit of claim 1, wherein said first, second, and third transistors are of a first conductivity type, the integrated circuit further comprising a fourth field effect transistor of a second conductivity type having a source connected to said second node, a gate connected to said first power supply voltage, and a drain connected to a fourth node, a logic device also being connected to said fourth node, said fourth transistor operating to establish a maximum voltage on said fourth node of substantially said first power supply voltage minus a threshold voltage of said fourth transistor, such that the logic device is protected from voltages applied to said second node and greater than said first power supply voltage.

3. The integrated circuit of claim 2, further comprising a fifth transistor of said first conductivity type having a source connected to said first power supply voltage, a gate connected to said fourth node, and a drain connected to a source of said first transistor, such that said first and fifth transistors form a series connection between said first power supply voltage and said first node.

4. The integrated circuit of claim 3, wherein said first, second, third, and fifth transistors are P channel devices and said fourth transistor is a N channel device.

5. The integrated circuit of claim 3, wherein said first, second, third, fourth, and fifth transistors represent transistors which are normally used to implement standard digital electronic circuits.

6. The integrated circuit of claim 3, wherein said first power supply voltage is nominally 3.3 volts, and wherein voltages applied to said first node range from approximately 3.3 volts to approximately 5.0 volts.

7. The integrated circuit of claim 3, wherein said second power supply voltage is nominally 5.0 volts such that said second transistor threshold voltage is approximately 1.2 volts, and said first power supply voltage is nominally 3.3 volts such that said third transistor threshold voltage is approximately 1.0 volts.

* * * * *